United States Patent [19]

Soneda

[11] Patent Number: 4,858,195
[45] Date of Patent: Aug. 15, 1989

[54] BIT LINE CHARGE SENSING APPARATUS HAVING CMOS THRESHOLD VOLTAGE COMPENSATION

[75] Inventor: Mitsuo Soneda, Kanagawa, Japan

[73] Assignee: Sony Corporation, Tokyo, Japan

[21] Appl. No.: 31,569

[22] Filed: Mar. 30, 1987

[30] Foreign Application Priority Data

May 22, 1986 [JP] Japan .................................. 61-116116

[51] Int. Cl.$^4$ ........................ G11C 7/00; G11C 11/00
[52] U.S. Cl. .................................... 365/205; 365/203; 365/190; 365/207; 365/154; 307/530
[58] Field of Search ................ 365/154, 156, 190, 205, 365/207, 208, 203; 357/42; 307/530

[56] References Cited

U.S. PATENT DOCUMENTS

| | | | |
|---|---|---|---|
| 4,355,377 | 10/1982 | Sud et al. .............................. | 365/203 |
| 4,408,303 | 10/1983 | Guterman et al. .............. | 365/205 X |
| 4,494,221 | 1/1985 | Hardee et al. ....................... | 365/203 |
| 4,532,609 | 7/1985 | Iizuka ............................... | 365/154 X |
| 4,547,685 | 10/1985 | Wong ................................ | 307/530 X |
| 4,802,128 | 1/1989 | Watanabe et al. ............... | 365/203 X |

FOREIGN PATENT DOCUMENTS

| | | | |
|---|---|---|---|
| 0243169 | 10/1987 | European Pat. Off. ............ | 365/205 |
| 57-12486 | 1/1982 | Japan .................................. | 365/154 |
| 59-132491 | 7/1984 | Japan .................................. | 365/205 |
| 61-208698 | 9/1986 | Japan .................................. | 365/156 |

OTHER PUBLICATIONS

IBM Technical Disclosure Bulletin, vol. 20, No. 1, Jun. 77, pp. 268–269; "Small Charge Sense Latch", by Cassidy et al.
IBM Tech. Discl. Bull., vol. 23, No. 7A, Dec. 80, pp. 3037–3038, "Sense Amp. W resistive Decoupling of Bit Lines", by Schuster.
K. Hardee et al., "A 30ns 64K CMOS RAM", 1984 IEEE International Solid–State Circuits Conference, Digest of Technical Papers, pp. 216–217.

*Primary Examiner*—Stuart N. Hecker
*Assistant Examiner*—Alfonso Garcia
*Attorney, Agent, or Firm*—Ronald P. Kananen

[57] ABSTRACT

An apparatus for sensing an electric charge appearing on at least one bit line of a memory cell comprises a pair of P-channel MOS (Metal Oxide Semiconductor) transistors whose sources are commonly connected, a pair of N-channel MOS (Metal Oxide Semiconductor) transistors whose sources are commonly connected, both pairs of the PMOS and NMOS transistors carrying out latch operations according to control signals supplied to their sources to sense the electric charge appearing on either a first or second bit line. In at least one of the pairs of PMOS and NMOS transistors, the gate of each MOS transistor is connected to either the first or second bit line via a capacitor, a first switching element is disposed between the drain of each MOS transistor and gate thereof, and a second switching element is disposed between the drain of each MOS transistor and a junction to either the first or second bit line. When control voltages applied to both sources of the PMOS transistors and NMOS transistors are changed and the switching elements are switched over during a precharge interval and sensing operation interval, the capacitors store voltages according to the respective threshold voltages of the PMOS and NMOS transistors so that divergence in the threshold voltages can be compensated for.

11 Claims, 4 Drawing Sheets

BIT LINE CHARGE SENSING APPARATUS HAVING CMOS THRESHOLD VOLTAGE COMPENSATION

BACKGROUND OF THE INVENTION

The present invention relates to an apparatus for sensing an electric charge appearing on a bit line of a memory cell, the apparatus being constituted by CMOS (Complementary Metal Oxide Semiconductor) transistors and used to read an information signal stored in the memory cells of a memory device. The present invention relates particularly to a sensing apparatus which compensates for divergence in the threshold voltages $V_{th}$ of the CMOS transistors to achieve accuracy in reading the information signal stored in the memory cells.

The information signal stored in a capacitor of each of the memory cells is read through a latch operation of the electric charge sensing apparatus described above (hereinafter referred to as a sensing amplifier).

If each of the transistors of the sensing amplifier constituting a pair of P (P-channel) MOS transistors or a pair of N (N-channel) MOS transistors have mutually the same dimensions and operating characteristics, the sensing amplifier carries out a highly sensitive sensing operation for sensing the electric charge appearing on a corresponding bit line connected to the memory cell even if the change in electric potential $\Delta V_s$ on the bit line due to the presence of the electric charge stored in the memory cell on the bit line is small.

However, due to recent trends toward miniaturization of each circuit element in the memory cell, as the dimensions of each memory circuit element have become small, the individual characteristics of the pairs of PMOS and NMOS transistors accordingly become divergent. In addition, the capacitance of each memory cell of the memory device accordingly becomes small. Therefore, more strict requirements for the sensing amplifier to sense the rise in the electric potential on the bit line result, i.e., more highly sensitive sensing amplifiers are required for memory devices.

Furthermore, if threshold voltages ($V_{th}$) of the respective transistors constituting the pair of NMOS and PMOS transistors are divergent, an input reduced offset voltage $V_{os}$ of the sensing amplifier becomes critical which depends upon a difference ($\Delta V_{th}$) between the threshold voltages of the transistors constituting the pair of transistors. Consequently, use of such sensing amplifiers will result in erroneous sensing operations depending on a relationship in magnitudes between the input reduced offset voltage $V_{os}$ and the difference $\Delta V_s$ in the threshold voltages.

SUMMARY OF THE INVENTION

It is, therefore, an object of the present invention to provide a sensing amplifier which can achieve a sensing operation with high sensitivity without suffering the influence of divergence in threshold voltages of the transistors constituting the pair of (MOS) transistors.

The above-described object can be achieved by providing an apparatus for sensing an electric charge appearing on a bit line of a memory cell, comprising: (a) a pair of P-channel MOS transistors whose sources are commonly connected; (b) a pair of N-channel MOS transistors whose sources are commonly connected; (c) first means connected between the bit line and a gate of at least one of the PMOS and NMOS transistors for storing a voltage according to a threshold voltage of a corresponding transistor to which the first means is connected during a precharge interval of the memory cell; (d) second means connected between the bit line and drain of at lest one of the PMOS and NMOS transistors for enabling the voltage according to the threshold voltage of the corresponding transistor to be stored in the first means during the precharge interval, the second means being operated to compensate the pairs of PMOS and NMOS transistors for divergence in the threshold voltages of the pairs of the PMOS and NMOS transistors during latching intervals of both pairs of PMOS and NMOS transistors.

The above-described object can be achieved by providing an apparatus for sensing an electric charge appearing on a bit line of a memory cell, comprising: (a) a pair of first MOS transistors whose sources are commonly connected; (b) a pair of second MOS transistors whose sources are commonly connected; (c) at least one pair of capacitors, each of the capacitors being connected between a gate of at least one of the first and second MOS transistors and the bit line; (d) at least one pair of first switching elements, each of the first switching elements being connected between a drain of at least one of the first and second MOS transistors and the gate thereof and being turned on during a precharge interval and turned off during a sensing operation interval; and (e) at least one pair of second switching elements, each of the second switching elements being connected between the bit line and drain of at least one of the first and second MOS transistors and being turned off during the precharge interval so that a voltage according to a threshold voltage of a corresponding MOS transistor to which the second switching element is connected is applied across a corresponding capacitor to which the gate of the corresponding transistor is connected and turned on during the sensing operation interval so that the gate potential of the corresponding transistor indicates the electric potential at the bit line with divergences between the threshold voltages of the respective first and second transistors compensated.

BRIEF DESCRIPTION OF THE DRAWINGS

A more complete understanding of the present invention may be obtained from the following description taken in conjunction with the attached drawings in which.

DETAILED DESCRIPTION OF THE PREFERRED EMBODIMENTS

Reference will hereinafter be made to the drawings in order to facilitate understanding of the present invention.

Before explaining preferred embodiments of the present invention, a previously proposed sensing amplifier will be described with reference to FIGS. 1 and 2.

Figure 1:
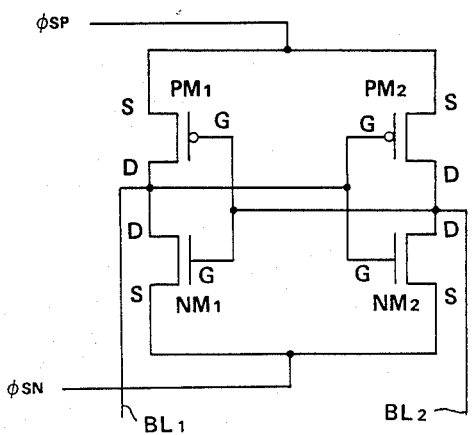
FIG. 1 is a circuit connection diagram of a previously proposed apparatus (sensing amplifier) for sensing an electric charge appearing on a bit line connected to a memory cell of a memory device.
Figure 2:
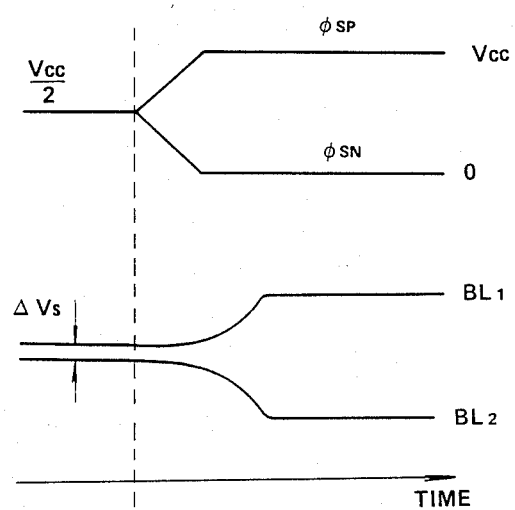
FIG. 2 is a timing chart for explaining an operation of the sensing amplifier shown in FIG. 1.

FIGS. 1 and 2 shown an electrical configuration and operation of the previously proposed sensing amplifier.

As shown in FIG. 1, the previously proposed sensing amplifier carries out a latch operation between a first bit line BL1 and a second bit line BL2. Both the first bit line BL1 and secondline BL2 are connected to a capacitor storing an information signal (bit "1" or bit "0") via an access transistor (not shown) incorporated in each memory cell of a memory device.

The sensing amplifier comprises a PMOS transistor $PM_1$ whose drain is connected to the first bit line BL1; and NMOS transistor $NM_1$ whose drain is connected to the first bit line BL1; another PMOS transistor $PM_2$ whose drain is connected to the second bit line BL2; and another NMOS transistor $NM_2$ whose drain is connected to the second bit line BL2. The first bit line BL1 is also connected to, gates of both of the PMOS transistor $PM_2$ and the NMOS transistor $NM_2$. In addition, the second bit line BL2 is connected to gates of both of the PMOS and NMOS transistors $PM_1$ and $NM_1$. Furthermore, respective sources of both PMOS transistors $PM_1$ and $PM_2$ commonly receive a control voltage $\phi_{SP}$ and respective sources of both NMOS transistors $NM_1$ and $NM_2$ commonly receive a control voltage $\phi_{SN}$.

As shown in FIGS. 1 and 2, a sensing amplifier having the construction described above first receives voltages of Vcc/2 as the control voltages $\phi_{SP}$ and $\phi_{SN}$ at the sources of the transistors $PM_1$, $PM_2$, $NM_1$, and $NM_2$. A voltage having a level of Vcc/2 is also supplied to both the first bit line BL1 and the second bit line BL2. Next, when a predetermined access transistor in the corresponding memory cell of the memory device becomes conductive in response to a selection signal transmitted on a word line in the memory device, for example, the voltage of the first bit line BL1 indicates $Vcc/2 + \Delta Vs$ due to the presence of an electric charge stored in the capacitor of the corresponding memory cell on the first bit line BL1. In this way, an electric potential of the first bit line BL1 is increased by $\Delta Vs$.

At this time, if the control voltages $\phi_{SP}$, $\phi_{SN}$ are changed to Vcc (bias voltage) and zero voltage, respectively, the "on" resistances of both of the PMOS transistor $PM_1$ and the NMOS transistor $NM_2$ become small. On the contrary, the "on" resistances of both PMOS transistor $PM_2$ and NMOS transistor $NM_1$ become large. Consequently, the latch operation of the information signal by means of both pairs of CMOS transistors $PM_1$ and $NM_1$ and $PM_2$ and $NM_2$ is carried out.

FIRST PREFERRED EMBODIMENT

Figure 3:
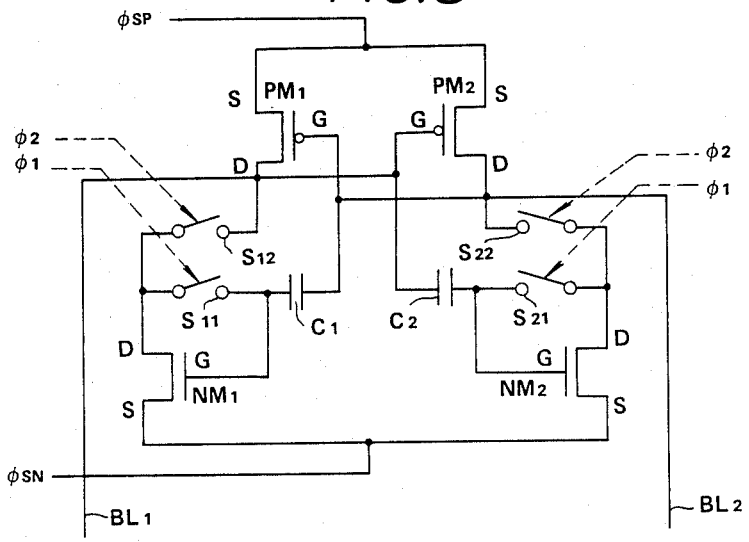
FIG. 3 is a circuit connection diagram of a first preferred embodiment of the sensing amplifier according to the present invention.
Figure 4:
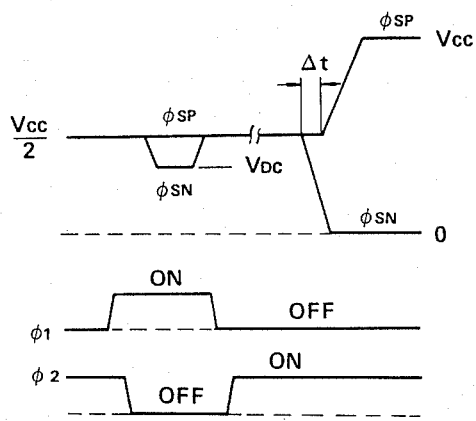
FIG. 4 is a timing chart for explaining an operation of the sensing amplifier shown in FIG. 3.

FIGS. 3 and 4 show construction and operation of the sensing amplifier in a first preferred embodiment according to the present invention. The sensing amplifier of the first preferred embodiment comprises a pair of PMOS transistors whose sources are commonly connected and a pair of NMOS transistors whose sources are commonly connected. The pair of PMOS transistors includes two PMOS transistors denoted by $PM_1$ and $PM_2$. The pair of NMOS transistors includes two NMOS transistors denoted by $NM_1$ and $NM_2$.

The sources of the two PMOS transistors $PM_1$ and $PM_2$ receive a control signal $\phi_{SP}$ whose voltage level is changed from Vcc/2 to Vcc with a time difference from another control voltage $\phi_{SN}$ to be described later. The first bit line BL1 is connected to a drain of the PMOS transistor $PM_1$ and to a gate of the PMOS transistor $PM_2$. In addition, the drain of the PMOS transistor $PM_2$ is connected to the second bit line BL2. The second bit line BL2 is also connected to a gate of the PMOS transistor $PM_1$.

The pair of transistors have mutually different threshold voltages $V_{th}$. The control voltage $\phi_{SN}$ is supplied to the sources of the NMOS transistors $NM_1$, $NM_2$.

The drainof the NMOS transistor $NM_1$ is connected to one end of a first switching element $S_{11}$ andone end of a second switching element $S_{12}$. The other end of the first switching element $S_{11}$ is connected to a gate of the NMOS transistor $NM_1$. In addition, these first and second switching elements $S_{11}$ and $S_{12}$ are controlled by means of other control signals $\phi_1$ and $\phi_2$, respectively.

The drain of the NMOS transistor $NM_2$ is connected to one end of a third switching element $S_{21}$ and to one end of a fourth switching element $S_{22}$.

It is noted that the other end of the third switching element $S_{21}$ is connected to a gate of the NMOS transistor $NM_2$.

In addition, the other end of the fourth switching element $S_{22}$ is connected to the second bit line BL2. These third and fourth switching elements $S_{21}$, $S_{22}$ are controlled by means of control signals $\phi_1$, $\phi_2$, in the same way as the first and second switching elements $S_{11}$, $S_{12}$.

Each gate of the pair of NMOS transistors $NM_1$ and $NM_2$ is connected to the bit line BL2 or BL1 via a capacitor $C_1$ or $C_2$ and to the corresponding gate of the pair of PMOS transistors $PM_1$ and $PM_2$ via the corresponding capacitor $C_1$ and $C_2$.

In detail, the gate of one NMOS transistor $NM_1$ is connected to the other end of the first switching element $S_{11}$ and to one end of the capacitor $C_1$. The second bit line BL2 is connected to the other end of the capacitor $C_1$. The gate of the NMOS transistor $NM_2$ is connected to the other end of the third switching element $S_{21}$ and to one end of the other capacitor $C_2$. The first bit line BL1 is connected to the other end of the capacitor $C_2$. These two capacitors $C_1$ and $C_2$ are provided to permit compensation for the divergence of $\Delta V_{th}$ (a difference in the threshold voltage of respective MOS transistors) in threshold voltages of the pair of transistors. The threshold voltage is usually defined as a minimum gate voltage which can pass a drain current between the drain and source of the MOS transistor.

Next, an operation of the sensing amplifier in the first preferred embodiment will be described with reference to FIG. 4.

Initially, with a logic level of the control signal $\phi_1$ turned to a "L" (low level), the first and third switching elements $S_{11}$, $S_{21}$ are turned off, respectively. With the logic level of the control signal $\phi_2$ turned to a "H" (high level), the second and fourth switching elements $S_{12}$, $S_{22}$ are turned on.

Next, with the level of the control signal $\phi_1$ changed from "L" to "H", the first and third switching elements $S_{11}$, $S_{21}$ are turned on. Furthermore, with the level of the control signal $\phi_2$ changed from "H" to "L", the second and fourth switching elements $S_{12}$, $S_{22}$ are turned off.

In this way, when each switching element is switched over in the sensing amplifier of the first preferred embodiment, each NMOS transistor $NM_1$, $NM_2$ takes the form of a diode connection and is changed to a circuit state in which each NMOS transistor $NM_1$, $NM_2$ is connected to each bit line BL1, BL2 via the corresponding capacitor $C_1$ and $C_2$.

Next, during a precharge interval before the sensing operation of the sensing amplifier, the level of the control signal $\phi_{SN}$ is changed by a potential difference of $V_{DC}$ from Vcc/2 to a level for precharging the two capacitors $C_1$ and $C_2$ (hereinafter referred to as $V_{DC}$ level). Consequently, voltgaes corresponding to respective threshold voltages $V_{th}$ of the MOS transistors $NM_1$ and $NM_2$ are applied across the corresponding capacitor $C_1$ and $C_2$.

In details, during the precharge interval each of the bit lines BL1 and BL2 is held at the Vcc/2 level. When the level of the control signal $\phi_{SN}$ is changed from Vcc/2 level to the $V_{DC}$ level for precharging the respective capacitors, gate potentials of the respective NMOS transistors $NM_1$ and $NM_2$ indicate $V_{DC}+V_{th2}$ and $V_{DC}+V_{th2}$, respectively. ($V_{th1}$ denotes a threshold voltage of the NMOS transistor $NM_1$ and $V_{th1}$ denotes a threshold voltage of the NMOS transistor $NM_2$). Hence, a voltage expressed by Vcc/2$-(V_{DC}+V_{th1})$ is applied across the capacitor $C_1$ and a voltage expressed by Vcc/2$-(V_{DC}+V_{th2})$ is applied across the capacitor $C_2$.

Next, the level of the control signal $\phi_{SN}$ is changed from $V_{DC}$ level to Vcc/2. The potential differences applied across the respective capacitors $C_1$ and $C_2$ are maintained thereacross.

As shown in FIG. 4, with the level of the control signal $\phi_1$ changed from "H" (ON) to "L" (OFF), the first and third switching elements $S_{11}$, $S_{21}$ are turned off, respectively. In addition, with the level of the control signal $\phi_2$ changed from "L" (OFF) to "H" (ON), the second and fourth switching elements $S_{12}$, $S_{22}$ are turned on. The switching operations of the first, second, third and fourth switching elements cause the connection between each gate and drain of the NMOS transistors $NM_1$ and $NM_2$ to be interrupted. Therefore, the NMOS transistors $NM_1$ and $NM_2$ are changed from the diode behavior state to the state corresponding to that of normal pair of transistors. In addition, the circuit construction of the sensing amplifier in the preferred embodiment is such that the respective capacitances $C_1$ and $C_2$ are dispsoed respectively between the gates of the NMOS transistors and bit lines BL1, BL2 in the previously proposed sensing amplifier shown in FIG. 1.

After the elapse of the precharge interval, the access transistor is turned on in response to a control signal on the word selection line. At this time, an electric charge stored in a capacitor of the corresponding selected memory cell appears, e.g., on the bit line BL1 connected to the sensing amplifier.

For example, when the information signal stored in the capacitor of the selected memory cell is "0" (logic level), the electric potential of the first bit line BL1 indicates Vcc/2$-\Delta$Vs. It is noted that the electric potential of the second bit line BL2 is, at this time, maintained at Vcc/2. On the other hand, if the above-described information signal is "1" (logic level), the electric potential of the bit line BL1, in turn, indicates Vcc/2$+\Delta$Vs.

In this way, the electric potential of the first bit line BL1 indicates Vcc/2$-\Delta$Vs and the voltage across the capacitor $C_2$ indicated by Vcc/2$-(V_{DC}+V_{th2})$ is maintained. Therefore, the gate potential of the NMOS transistor $MN_2$ indicates Vcc/2$-\Delta$Vs$-($Vcc/2$-(V_{DC}+V_{th2}))$, i.e. $V_{DC}+V_{th2}-\Delta$Vs. On the other hand, since the electric potential of the second bit line BL2 remains at Vcc/2, the gate potential of the NMOS transistor $NM_1$ via the capacitor $C_1$ indicates Vcc/2$-($Vcc/2$-(V_{DC}+V_{th1}))$, i.e., $V_{DC}+V_{th1}$.

In the way described above, the respective threshold voltages $V_{th1}$, $V_{th2}$ of the gate potentials of the NMOS transistors $NM_1$, $NM_2$ are higher than ideal values thereof. The respective gate potentials of the NMOS transistors $NM_1$ and $NM_2$ with respect to their sources are then completely compensated by the threshold voltages $V_{th1}$, $V_{th2}$ inherent in the respective NMOS transistors $NM_1$, $NM_2$. Hence, the sensing amplifier in the first preferred embodiment provides a very high sensitivity for sensing the electric charge appearing on either of the bit lines.

After the electric charge stored in the capacitor of the selected memory cell is supplied to the sensing amplifier via the first or second bit line BL1 or BL2, the sensing amplifier in this embodiment starts the sensing operation.

In the previously proposed sensing amplifier shown in FIG. 1, the sensing operation is carried out not only for the pair of the NMOS transistors but also for the pair of the PMOS transistors. Therefore, as shown in FIG. 2, both the control signal $\phi_{SN}$ and control signal $\phi_{SP}$ are simultaneously changed from Vcc/2 level to zero level and to Vcc level, respectively. However, in the sensing amplifier of the first preferred embodiment, the switching operations of the first, second, third, and fourth switching elements $S_{11}$, $S_{21}$, $S_{12}$, and $S_{22}$ cause voltages whose levels are varied depending on the respective threshold voltages to be applied across the capacitors $C_1$ and $C_2$. The capacitors $C_1$ and $C_2$ compensate for the divergence in the respective threshold voltages $V_{th1}$, $V_{th2}$ of the NMOS transistors $NM_1$ and $NM_2$ constituting the pair of the NMOS transistors so that the input reduced offset voltages $V_{OS}$ of both MOS transistors can be cancelled. Therefore, only the pair of the NMOS transistors is first latched. Thereafter, the two PMOS transistors $PM_1$ and $PM_2$ constituting the pair of PMOS transistors are latched using an identified data (electric potential) after the latch operation by means of the NMOS transistor pair. The latch operation of the pair of the PMOS transistors can thus be assured without a special circuit construction for compensating the PMOS transistors $PM_1$ and $PM_2$ for the divergence in the threshold voltages of the PMOS transistors $PM_1$ and $PM_2$.

That is to say, since the voltages to compensate the NMOS transistors $NM_1$ and $NM_2$ for the threshold voltages $V_{th1}$ and $V_{th2}$ of the respective NMOS transistors $NM_1$ and $NM_2$ are stored in the capacitors $C_1$ and $C_2$ during the above-described precharge interval as shown in FIG. 4, the gate potential of the NMOS transistor $NM_2$ indicates $V_{DC}+V_{th2}-\Delta$Vs and the gate potential of the NMOS transistor indicates $V_{DC}+V_{th1}$, e.g., when the potential of the first bit line BL1 is changed by $-\Delta$Vs.

When the sensing operation of the sensing amplifier is started, the level of the control signal $\phi_{SN}$ is changed from Vcc/2 to zero level. When the voltages between the gates and sources of the respective NMOS transistor NM$_1$ and NM$_2$ exceed their corresponding threshold voltages V$_{th1}$ and V$_{th2}$, either of the two NMOS transistors is first turned on. Since the difference between the gate and source potentials is only $|-\Delta Vs|$ and the divergence in the threshold voltage V$_{th1}$ and V$_{th2}$ is completely compensated, one of the NMOS transistors NM$_1$ whose gate potential is higher than that of the other NMOS transistor by $\Delta Vs$ is first turned on. Consequently, the latch operation for the information signal of the pair of NMOS transistors is started.

Upon the start of the above-described latch operation, the control signal $\phi_{SP}$ is changed from Vcc/2 to Cvv with the constant time difference $\Delta t$ with respect to the control signal $\phi_{SN}$ as shown in FIG. 4. At this time, the PMOS transistors PM$_1$ and PM$_2$ constituting the pair of the PMOS transistors, in turn, start the latch operation. The potential of each bit line BL1 and BL2 indicates an identified level of potential due to the latch operation of the pair of the NMOS transistors. Hence, the pair of the PMOS transistors can carry out an accurate latch operation to sense the identified level of potential without special provision of circuit elements for the threshold voltage divergence compensation.

It is noted that the constant time difference $\Delta t$ may have a length of time for which the potential at the pair of NMOS transistors are amplified and may have a value larger than that of the divergence in $\Delta V_{th}$ of the pair of PMOS transistors when the electric potential is identified by means of the latch operation of the pair of NMOS transistors. In other words, when the time difference $\Delta t$ is set in the way described above, an accurate latch operation can be achieved without the special compensation of the pair of PMOS transistors for $\Delta V_{th}$.

Since the voltage corresponding to the divergence $\Delta V_{th}$ in each threshold voltage of the NMOS transistors constituting the pair of NMOS transistors can be stored in the respective capacitors C$_1$ and C$_2$ of the sensing amplifier in the first preferred embodiment, the latch operation in which the divergence $\Delta V_{th}$ is completely compensated for the divergence $\Delta V_{th}$ can be achieved.

In addition, even when the capacitance of each memory cell of the memory device becomes reduced, an error-free latch operation can be achieved due to the high sensitivity of the sensing amplifier in the first preferred embodiment. Therefore, the sensing amplifier according to the present invention can be applied to a highly integrated circuit memory device.

In addition, since the sensing amplifier in the first preferred embodiment can compensate for the divergence $\Delta V_{th}$, the improvement of a yield of manufacturing memory devices can be achieved. Furthermore, even when the threshold voltage is changed due to aging effects of the pairs of NMOS and PMOS transistors, the input reduced offset voltage V$_{OS}$ can accurately be eliminated. Therefore, reliability of the sensing amplifier can be increased.

SECOND PREFERRED EMBODIMENT

In the first preferred embodiment described above, the capacitors and switching elements are disposed for compensating the pair of the NMOS transistors for the divergence in the threshold voltages thereof. In a second preferred embodiment according to the present invention, however, they are disposed for compensating the pair of the PMOS transistors for divergence in the threshold voltages thereof.

Figure 5:
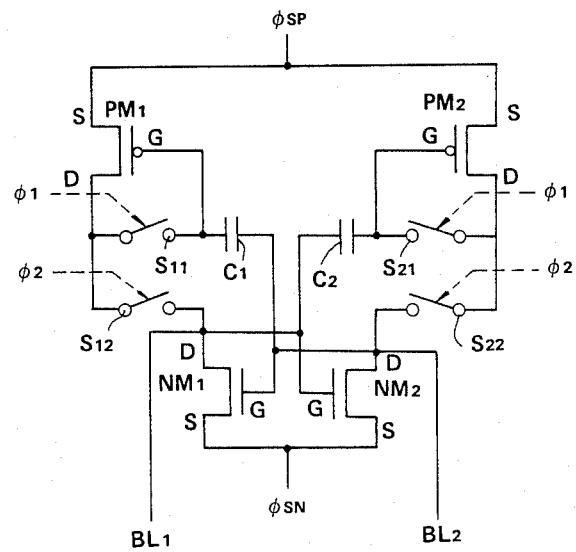
FIG. 5 is a circuit connection diagram of a second preferred embodiment of the sensing amplifier according to the present invention.
Figure 6:
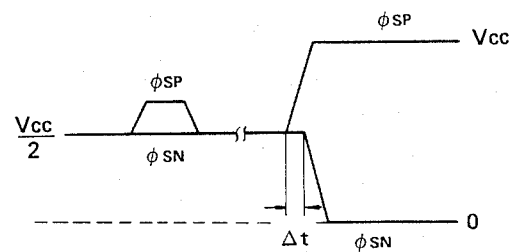
FIG. 6 is a timing chart for explaining an operation of the sensing amplifier shown in FIG. 5.

FIGS. 5 and 6 show the construction and signal timing chart of the sensing amplifier in the second preferred embodiment.

As shown in FIG. 5, the capacitors C$_1$ and C$_2$ and first, second, third, and fourth switching elements S$_{11}$, S$_{21}$, 2$_{12}$, and S$_{22}$ are connected to the pair of PMOS transistors.

The sensing amplifier in the second preferred embodiment includes the pair of PMOS transistors whose sources are commonly connected and the pair of NMOS transistors whose sources are commonly connected. The pair of PMOS transistors includes the two PMOS transistors PM$_1$ and PM$_2$. The pair of NMOS transistors includes the two NMOS transistors. NM$_1$ and NM$_2$.

In the sensing amplifier of the second preferred embodiment, the control signal $\phi_{SN}$ whose level is changed to zero level with the constant time difference $\Delta t$ from the control signal $\phi SP$ to be described later is supplied to the sources of the NMOS transistors NM$_1$ and NM$_2$. The drain of the NMOS transistor NM$_1$ is connected to the first bit line BL1. The drain of the NMOS transistor MN$_2$ is connected to the second bit line BL2. The gate of the NMOS transistor NM$_1$ is connected to the second bit line BL2.

The control voltage $\phi_{SP}$ is supplied to the sources of the PMOS transistors PM$_1$ and PM$_2$ in the pair of PMOS transistors which are compensated for the divergence of $\Delta V_{th}$.

One end of the first switching element S$_{11}$ and one end of the second switching element are connected to the drain of the PMOS transistor PM$_1$. The other end of the first switching element S$_{11}$ is connected to the gate of the PMOS transistor PM$_1$. In addition, the other end of the second switching element S$_{12}$ is connected to the first bit line BL1. The first and second switching elements S$_{11}$ and S$_{12}$ are controlled by means of the control signals $\phi_1$ and $\phi_2$. On the other hand, one end of the third switching elmeent S$_{21}$ and one end of the fourth switching element S$_{22}$ are connected to the drain of the PMOS transistor PM$_2$. The other end of the third switching element S$_{21}$ is connected to the second bit line BL2. These third and fourth switching elements S$_{21}$ and S$_{22}$ are controlled by means of the control signals $\phi_1$ and $\phi_2$, respectively, in the same way as the first and second switching elements S$_{11}$ and S$_{12}$. Each gate of the PMOS transistors PM$_1$ and PM$_2$ constituting the pair of PMOS transistors of the sensing amplifier in the second preferred embodiment is coupled to the corresponding capacitor C$_1$ and C$_2$. In detail, the gate of the PMOS transistor PM$_1$ is connected to the other end of the first switching element S$_{11}$ and to one end of the capacitor C$_1$. The other end of the capacitor C$_1$ is connected to the second bit line BL2. On the other hand, the gate of the PMOS transistor PM$_2$ is connected to the other end of the first switching element S$_{21}$ and to one end of the capacitor C$_2$. The other end of the capacitor C$_2$ is connected to the first bit line BL1. These capacitors C$_1$ and C$_2$ can serve to compensate the PMOS transistors for the divergence of $\Delta V_{th}$ in the threshold voltages of the pair of PMOS transistors.

The sensing amplifier in the second preferred embodiment changes from the normal sensing amplifier state to the circuit state in which transistors to which the respective capacitors are connected via diodes are disposed in series with each other when the levels of the control signals $\phi_1$ and $\phi_2$ are switched during the precharge interval as shown in FIG. 6 in the same way as the sensing amplifier in the first preferred embodiment.

The level of the control signal $\phi_{SP}$ is increased by a predetermined voltage for a constant interval in the case of the second preferred embodiment so that the voltages corresponding to the respective threshold voltages $V_{th1}$ and $V_{th2}$ of the PMOS transistors PM$_1$ and PM$_2$ are maintained across the respective capacitors C$_1$ and C$_2$.

In the same way as the first preferred embodiment, the information signal stored in the capacitor of the corresponding memory cell is transmitted on either the first or second bit line BL1 or BL2. Subsequently, the control signal $\phi_{SP}$ is changed from Vcc/2 level to Vcc level so that the latch operation by means of the PMOS transistors PM$_1$ and PM$_2$ is started.

At this time, since the divergence of $V_{th}$ is compensated for by means of the capacitors C$_1$ and C$_2$ in the PMOS transistors PM$_1$ and PM$_2$, the electric charge appearing on either the first or second bit line is accurately sensed. Furthermore, the latch operation of the NMOS transistors NM$_1$ and NM$_2$ is carried out by means of the control signal $\phi_{SN}$ after the constant time difference $\Delta t$ in the same way as the first preferred embodiment. In this case, since the latch operation of the NMOS transistors is carried out on the basis of the data identified by the latch operation of the pair of PMOS transistors, the sensing operation of the NMOS transistors can be assured without connections of the NMOS transistors NM$_1$ and NM$_2$ to respective capacitors C$_1$ and C$_2$ for compensating for the divergence in threshold voltages.

In the sensing amplifier of the second preferred embodiment, the voltages corresponding to the divergence of $\Delta V_{th}$ in the threshold voltages of the PMOS transistors PM$_1$ and PM$_2$ can be stored in the respective capacitors C$_1$ and C$_2$. Therefore, a latch operation in which the divergence of $\Delta V_{th}$ is completely compensated for can be achieved. In addition, the sensing amplifier in the second preferred embodiment is applicable to highly integrated circuit memory devices. The other effects of the sensing amplifier of the second preferred embodiment are substantially the same as those of the first preferred embodiment.

THIRD PREFERRED EMBODIMENT

The sensing amplifier in a third preferred embodiment includes the two pairs of PMOS and NMOS transistors to both of which the capacitors and first, second, third, and fourth switching elements are connected which compensate for the divergence in threshold voltages of both pair of PMOS and NMOS transistors.

Figure 7:
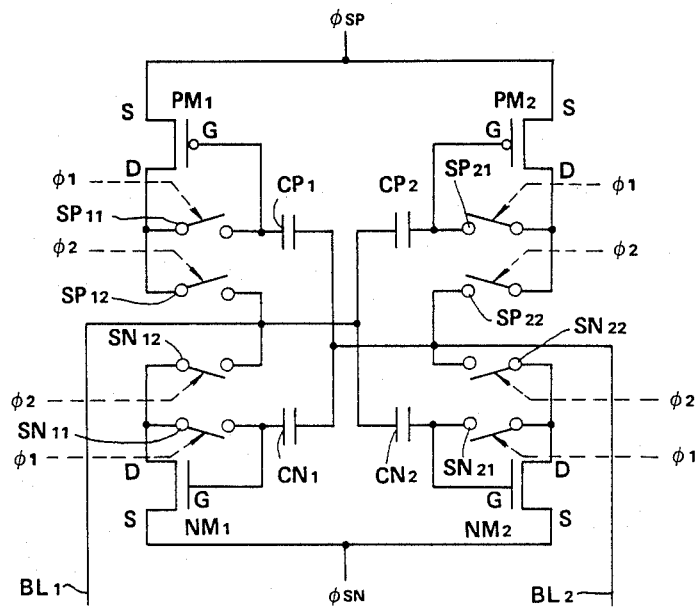
FIG. 7 is a circuit connection diagram of the sensing amplifier according to the present invention.
Figure 8:
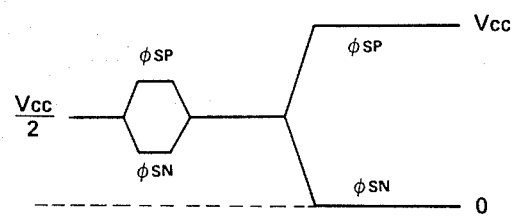
FIG. 8 is a timing chart for explaining an operation of the sensing amplifier shown in FIG. 7.

FIGS. 7 and 8 show circuit construction and operation of the sensing amplifier in the third preferred embodiment.

As shown in FIG. 7, the sources of the PMOS transistors PM$_1$ and PM$_2$ constituting the pair of PMOS transistors and NMOS transistors NM$_1$ and NM$_2$ constituting the pair of NMOS transistors are commonly connected. Each source of these MOS transistors receives the control signals $\phi_{SP}$ and $\phi_{SN}$. The gates of the PMOS transistor PM$_1$ and NMOS transistor NM$_1$ are connected to the second bit line BL2 via capacitors C$_{P1}$ and C$_{N1}$, respectively. The gates of the PMOS transistor PM$_2$ and NMOS transistor NM$_2$ are connected to the first bit line BL1 via capacitors C$_{P2}$ and C$_{N2}$. Furthermore, the gate of each of the NMOS transistors PM$_1$, PM$_2$, NM$_1$ and NM$_2$ is connected to the drain of the corresponding transistor via the corresponding first and third switching elements SP$_{11}$, SP$_{21}$, SN$_{11}$, and SN$_{21}$. In addition, each drain of the MOS transistors PM$_1$ and NM$_1$ is connected to the first bit line BL1 via the respective second switching elements SP$_{12}$ and SN$_{12}$ which are controlled by means of the control signal $\phi_2$.

In a sensing amplifier of the third preferred embodiment having the construction described above, voltages corresponding to the threshold voltages of the respective transistors for compensating for the divergence in $V_{th}$ are applied across the capacitors C$_{P1}$, C$_{N1}$, C$_{P2}$, and C$_{N2}$ by means of the control signals $\phi_{SP}$ and $\phi_{SN}$ during the precharge interval before the sensing operation of the sensing amplifier as shown in FIG. 8. The voltages described above are stored and held in the corresponding capacitors C$_{P1}$, C$_{N1}$, C$_{P2}$, and C$_{N2}$. Thereafter, the control signals $\phi_{SP}$ and $\phi_{SN}$ are changed to Vcc level and to zero level, respectively, so that the divergence in the threshold voltages are compensated and an accurate sensing operation of the sensing amplifier for the information signal on either the first or second bit line can be achieved. In this embodiment, the constant time difference $\Delta t$ is not required.

EFFECT

In the first, second, and third preferred embodiments, the first, second, third, and fourth switching elements may comprise PMOS or NMOS transistors. In addition, the control signals $\phi_1$, $\phi_2$, $\phi_{SP}$, $\phi_{SN}$ may be derived by a memory controller installed in the memory device.

The present invention is applicable to the sensing amplifier constituted by the pair of CMOS transistors in the memory device. The sensing amplifier according to the present invention can assure an accurate sensing operation without reduction of sensitivity for the electric charge on the bit line due to the divergence in the threshold voltages of the respective transistors. Even when the circuit elements constituting such a memory device as described above are miniaturized, the sensing amplifier according to the present invention can have a high sensitivity for sensing the electric charge appearing on the information bit line. Since the sensing amplifier according to the present invention can assure the sensing operation even when a capacitance of the capacitor incorporated in each memory cell is reduced due to the miniaturization of the IC memory device, high integrations of memory devices can be achieved in practice. Furthermore, since the sensing amplifier according to the present invention can completely compensate the MOS transistors for the divergence in the threshold voltages of the transistors, the yield of manufacturing memory devices can be improved and ther accurate sensing operation can be ensured for a long time without suffering from the influences of the aging effects on the sensing amplifier.

What is claimed is:

1. An apparatus for sensing an electric charge appearing on a bit line of a memory cell, comprising:
   (a) a pair of P-channel MOS transistors whose sources are commonly connected;
   (b) a pair of N-channel MOS transistors whose sources are commonly connected;
   (c) first means connected between the bit line and a gate of at least one of the PMOS and NMOS transistors storing a voltage according to a threshold voltage of a corresponding transistor to which the first means is connected during a precharge interval of the memory cell;

(d) second means connected between the bit line and drain of at least one of the PMOS and NMOS transistors enabling the voltage according to the threshold voltage of the corresponding transistor to be stored in the first means during the precharge interval, the second means being operated to compensate the pairs of PMOS and NMOS transistors for divergence in the threshold voltages of the pairs of the PMOS and NMOS transistors during latching intervals of both pairs of PMOS and NMOS transistors.

2. The apparatus according to claim 1, wherein the first means comprises a capacitor.

3. An apparatus for sensing an electric charge appearing on a bit line of a memory cell, comprising:
   (a) a pair of first MOS transistors whose sources are commonly connected;
   (b) a pair of second MOS transistors whose sources are commonly connected;
   (c) at least one pair of capacitors, each of the capacitors being connected between a gate of at least one of the first and second MOS transistors and the bit line; (d) at least one pair of first switching elements, each of the first switching elements being connected between a drain of at least one of the first and second MOS transistors and the gate thereof and being turned on during a precharge interval and turned off during a sensing operation interval; and
   (e) at least one pair of second switching elements, each of the second switching elements being connected between the bit line and drain of at least one of the first and second MOS transistors and being turned off during the precharge interval so that a voltage according to a threshold voltage of a corresponding MOS transistor to which the second switching element is connected is applied across a corresponding capacitor to which the gate of the corresponding transistor is connected and turned on during the sensing operation interval so that the gate potential of the corresponding transistor indicates the electric potential at the bit line with compensation for divergences in the threshold voltages of the respective first and second transistors.

4. The apparatus according to claim 3, wherein the first MOS transistors comprise N-channel MOS transistors, the second MOS transistors comprise P-channel MOS transistors, each of the capacitors is connected between the gate of one of the N-channel MOS transistors and the bit line, each of the first switching elements is connected between the drain of one of the N-channel MOS transistors and the gate thereof, each of the second switching elements is connected between the bit line and drain of one of the N-channel MOS transistors, the sources of the P-channel MOS transistors receiving a first voltage equal to that on the bit line during the precharge interval and a second voltage having a predetermined higher voltage level than that of the bit line during the sensing operation interval and the sources of the N-channel MOS transistors receiving a third voltage for precharging the pair of capacitors so that the threshold voltages of the respective NMOS transistors are applied across the capacitors and thereafter the first voltage during the precharge interval and receiving a zero voltage during the sensing operation interval with a fixed time difference from the second voltage applied to the sources of the P-channel MOS transistors.

5. The apparatus according to claim 3, wherein the first MOS transistors comprise P-channel MOS transistors, the second MOS transistors comprise N-channel MOS transistors, each of the capacitors is connected between the gate of one of the P-channel MOS transistors and bit line, each of the first switching elements is connected between the drain of one of the P-channel MOS transistors and the gate thereof, each of the second switching elements is connected between the bit line and drain of one of the P-channel MOS transistors, the sources of the P-channel MOS transistors receiving a first voltage for precharging the pair of capacitors so that the threshold voltages of the respective MOS transistors are applied across the pair of capacitors and thereafter receiving a second voltage equal to that of the bit line during the precharge interval and receiving a second voltage having a predetermined higher voltage than the voltage of the bit line during the sensing operation interval and the sources of the N-MOS transistors receiving the second voltage equal to that of the bit line during the precharge operation and receiving a zero voltage with a fixed time difference from the second voltage applied to the sources of the P-MOS transistors during the sensing operation interval.

6. The apparatus according to claim 3, wherein the first MOS transistors comprise P-channel MOS transistors, the second MOS transistors comprise N-channel MOS transistors, each of the capacitors is connected between the gate of one of the P-channel MOS transistors and bit line and between the gate of the N-channel MOS transistors and bit line, each of the first switching elements is connected between the drain of one of the P-channel MOS transistors and the gate thereof and between the drain of one of the N-channel MOS transistors and the gate thereof, each of the second switching elements is connected between the bit line and drain of one of the N-channel MOS transistors, the sources of the P-channel MOS transistors receiving a first voltage for precharging the pair of corresponding capacitors so that the threshold voltages of the respective P-channel MOS transistors are applied across the pair of corresponding capacitors, thereafter receiving a second voltage equal to that of the bit line during the precharge interval and receiving a third voltage having a predetermined higher voltage level than the second voltage during the sensing operation interval, and the sources of the N-channel MOS transistors receiving a fourth voltage for precharging the pair of corresponding capacitors so that the threshold voltages of the respective N-channel MOS transistors are applied across the pair of corresponding capacitors, thereafter receiving the second voltage during the precharge interval, and receiving a zero voltage during the sensing operation interval.

7. The apparatus according to claim 4, wherein the fixed time difference corresponds to a time in which electric potentials at the pair of NMOS transistors are amplified.

8. The apparatus according to claim 4 wherein the predetermined higher voltage level of said second voltage is about two times the voltage of the bit line during the sensing operation interval.

9. The apparatus according to claim 5 wherein the predetermined higher voltage level of said second voltage is about two times the voltage of the bit line during the sensing operation interval.

10. The apparatus according to claim 6 wherein said third voltage is about two times higher than the second voltage during the sensing operation interval.

11. An apparatus for sensing an electric charge appearing on a bit line of a memory cell, comprising:
    (a) a pair of P-channel MOS transistors having their sources commonly connected;
    (b) a pair of N-channel MOS transistors having their sources commonly connected;
    (c) a first control signal provided to the sources of said pair of P-channel MOS transistors;
    (d) a second control signal provided to the sources of said pair of N-channel MOS transistors;
    (e) a first bit line connected to a drain of one of said MOS transistors of either of said P-channel pair or said N-channel pair, and to the gate of the other of said P-channel pair or said N-channel pair;
    (f) a second bit line connected to a drain of the other of said MOS transistors of either of said P-channel pair or said N-channel pair corresponding to the connection of said first bit line, and to the gate of the one of said pair of said P-channel pair or said N-channel pair;
    (g) a first means connected between a bit line and a gate of at least one of the PMOS and NMOS transistors storing a voltage corresponding to the threshold voltage of a corresponding transistor to which the first means is connected during a precharge interval of the memory cell;
    (h) a second means connected between the bit line and the drain of at least one of the PMOS and NMOS transistors enabling the voltage according to the threshold voltage of the corresponding transistor to be stored in the first means during the precharge interval, said second means being operated to compensate the pairs of PMOS and NMOS transistors for divergence in the threshold voltages of the pairs of the PMSO and NMOS transistors during latching intervals of both pairs of PMOS and NMOS transistors; and
    (i) means for enabling said second means, said enabling means being coordinated with said first and said second control signals so that the voltage stored by said first means during said precharge interval affects the signal sensed on said bit line during said latching interval, whereby differences in threshold voltages in the pairs of said NMOS and PMOS transistors is compensated during sensing.

* * * * *